(12) United States Patent
Peng et al.

(10) Patent No.: US 11,489,033 B2
(45) Date of Patent: Nov. 1, 2022

(54) WIRE STRUCTURE, DISPLAY PANEL, DISPLAY DEVICE WITH HIGH THERMAL CONDUCTIVITY LAYER AND MANUFACTURING METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Liman Peng, Beijing (CN); Qi Liu, Beijing (CN); Qianqian Zhang, Beijing (CN); Zhiyong Xue, Beijing (CN); Yan Wu, Beijing (CN); Jin Yang, Beijing (CN); Guoping Zhang, Beijing (CN); Haifeng Xu, Beijing (CN); Wenxiu Li, Beijing (CN); Lei Wang, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 189 days.

(21) Appl. No.: 16/756,144

(22) PCT Filed: Sep. 24, 2019

(86) PCT No.: PCT/CN2019/107458
§ 371 (c)(1),
(2) Date: Apr. 15, 2020

(87) PCT Pub. No.: WO2020/082961
PCT Pub. Date: Apr. 30, 2020

(65) Prior Publication Data
US 2021/0225985 A1    Jul. 22, 2021

(30) Foreign Application Priority Data

Oct. 22, 2018    (CN) .......................... 201811229077.0

(51) Int. Cl.
*H01L 27/32*    (2006.01)
*H01L 51/52*    (2006.01)

(52) U.S. Cl.
CPC ........ *H01L 27/3276* (2013.01); *H01L 51/529* (2013.01); *H01L 2227/323* (2013.01)

(58) Field of Classification Search
CPC ............... H01L 27/3276; H01L 51/529; H01L 2227/323
See application file for complete search history.

(56) References Cited

U.S. PATENT DOCUMENTS

| 2002/0101156 A1 | 8/2002 | Park et al. |
| 2003/0107127 A1 | 6/2003 | Murai |
| (Continued) | | |

FOREIGN PATENT DOCUMENTS

| CN | 1469692 A | 1/2004 |
| CN | 1472823 A | 2/2004 |
| (Continued) | | |

*Primary Examiner* — Lex H Malsawma
(74) *Attorney, Agent, or Firm* — The Webb Law Firm

(57) ABSTRACT

The present disclosure provides a wire structure for a display panel, a display panel, a display device, and a manufacturing method. The wire structure includes a first wire layer and a thermally conductive layer above the first wire layer. A thermal conductivity of the thermally conductive layer is greater than a thermal conductivity of the first wire layer.

16 Claims, 3 Drawing Sheets

(56) References Cited

U.S. PATENT DOCUMENTS

| | | | |
|---|---|---|---|
| 2004/0012328 A1 | 1/2004 | Arnold et al. | |
| 2005/0095459 A1 | 5/2005 | Chin et al. | |
| 2016/0284781 A1 | 9/2016 | Jiang et al. | |
| 2017/0194596 A1* | 7/2017 | Shen | H01L 51/5237 |
| 2018/0123080 A1 | 5/2018 | Kim et al. | |
| 2019/0081123 A1 | 3/2019 | Wu et al. | |
| 2021/0384457 A1* | 12/2021 | Jang | H01L 27/322 |

FOREIGN PATENT DOCUMENTS

| | | |
|---|---|---|
| CN | 1180303 U | 12/2004 |
| CN | 104868058 A | 8/2015 |
| CN | 205488133 U | 8/2016 |
| CN | 107068724 A | 8/2017 |
| CN | 108010916 A | 5/2018 |
| CN | 109119455 A | 1/2019 |

\* cited by examiner

WIRE STRUCTURE, DISPLAY PANEL, DISPLAY DEVICE WITH HIGH THERMAL CONDUCTIVITY LAYER AND MANUFACTURING METHOD

CROSS-REFERENCE TO RELATED APPLICATIONS

This application is the United States national phase of International Application No. PCT/CN2019/107458 filed Sep. 24, 2019, and claims priority to China Patent Application No. 201811229077.0 filed on Oct. 22, 2018, the disclosures of which are hereby incorporated by reference in their entirety.

TECHNICAL FIELD

The present disclosure relates to a wire structure for a display panel, a display panel, a display device, and a manufacturing method.

BACKGROUND

AMOLED (Active Matrix Organic Light Emitting Diode) is an active light emitting device. This AMOLED emits light mainly in a current driving manner, so that the required driving circuit is relatively complicated. Such complicated driving circuit increases a difficulty of the process and will increase the occurrence of some undesirable risks.

For example, uneven TFT (Thin Film Transistor) characteristics or the like might cause a problem of bright spots. That is, when a certain pixel emits light, it is brighter than surrounding pixels, so that it is a bright spot visually. For this problem, after the display panel is completed, an aging process may be performed to eliminate such undesirable display problems. During the aging process is performed on the TFT, a high voltage needs to be applied to an interior of the display panel. For example, the high voltage may comprise a power supply voltage VDD of 15V, a high potential of 20V, or the like.

SUMMARY

According to an aspect of embodiments of the present disclosure, a wire structure for a display panel is provided. The wire structure comprises: a first wire layer; and a thermally conductive layer above the first wire layer, wherein a thermal conductivity of the thermally conductive layer is greater than a thermal conductivity of the first wire layer.

In some embodiments, the wire structure further comprises a first insulating layer between the first wire layer and the thermally conductive layer.

In some embodiments, the thermal conductivity of the thermally conductive layer is greater than 200 W/(m·K).

In some embodiments, a material of the thermally conductive layer comprises at least one of aluminum, copper, gold or silver.

In some embodiments, an orthographic projection of the first wire layer on a plane where the thermally conductive layer is located at least partially overlaps with an orthographic projection of the thermally conductive layer on the plane where the thermally conductive layer is located.

In some embodiments, the first wire layer is electrically connected to a gate of a thin film transistor of the display panel.

In some embodiments, the first wire layer comprises a plurality of first wire portions spaced apart and in a same layer, wherein the thermally conductive layer is above the plurality of first wire portions.

In some embodiments, an orthographic projection of the plurality of first wire portions on a plane where the thermally conductive layer is located at least partially overlaps with an orthographic projection of the thermally conductive layer on the plane where the thermally conductive layer is located.

In some embodiments, the wire structure further comprises: a second insulating layer on a side of the thermally conductive layer facing away from the first wire layer; and a second wire layer on a side of the second insulating layer facing away from the thermally conductive layer, wherein the second wire layer is electrically connected to a source or a drain of a thin film transistor of the display panel.

According to another aspect of embodiments of the present disclosure, a display panel is provided. The display panel comprises the wire structure as described above.

According to another aspect of embodiments of the present disclosure, a display device is provided. The display device comprises the display panel as described above.

According to another aspect of embodiments of the present disclosure, a manufacturing method of a wire structure for a display panel is provided. The manufacturing method comprises: forming a first wire layer; and forming a thermally conductive layer above the first wire layer, wherein a thermal conductivity of the thermally conductive layer is greater than a thermal conductivity of the first wire layer.

In some embodiments, the forming of the thermally conductive layer above the first wire layer comprises: forming a first insulating layer on the first wire layer; and forming the thermally conductive layer on a side of the first insulating layer facing away from the first wire layer.

In some embodiments, a material of the thermally conductive layer comprises at least one of aluminum, copper, gold or silver.

In some embodiments, the forming of the first wire layer comprises: forming the first wire layer electrically connected to a gate of a thin film transistor of the display panel.

In some embodiments, the forming of the first wire layer comprises: forming a plurality of first wire portions spaced apart in a same layer, wherein the thermally conductive layer is formed above the plurality of first wire portions.

In some embodiments, the manufacturing method further comprises: forming a second insulating layer on a side of the thermally conductive layer facing away from the first wire layer; and forming a second wire layer on a side of the second insulating layer facing away from the thermally conductive layer, wherein the second wire layer is electrically connected to a source or a drain of a thin film transistor of the display panel.

In some embodiments, the manufacturing method further comprises: forming a second wire layer on a side of the first insulating layer facing away from the first wire layer, wherein the second wire layer is electrically connected to a source or a drain of a thin film transistor of the display panel; wherein, the thermally conductive layer is formed during a process of forming the second wire layer.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
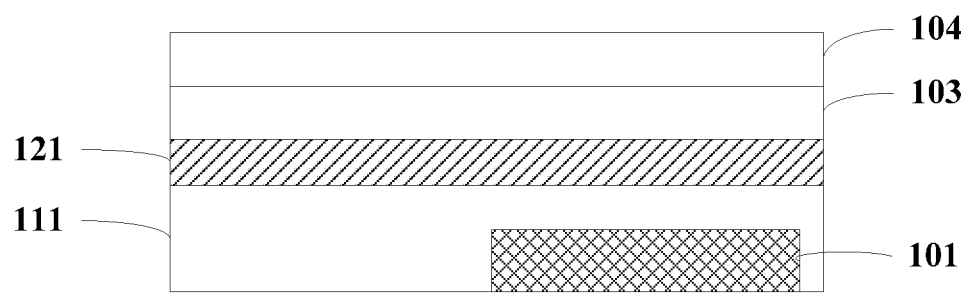
FIG. 1A is a cross-sectional view showing a wire structure for a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that after a high voltage is applied to an interior of the display panel, for some wire areas to which a high voltage is input, the instantaneous heat is too large to be dissipated, so that the inorganic layer above the metal wire is burnt or peeled off. The problem of burns may be found during appearance detection.

For example, for AMOLED products, in the process of performing the aging process on the TFT, the power supply voltage Vdd that needs to be applied is usually a high voltage (e.g., 10-20V). In some wires, for example, for a wire electrically connected to a gate of a thin film transistor (which may be referred to as a gate wire for short), a high voltage applied to the wire may cause burns to the wire. After research, the inventors of the present disclosure have found that at a burnt position, an insulating layer (e.g., a planarization layer (referred to PLN for short) and/or a pixel definition layer (referred to PDL for short)) above the wire might peel off. This is mainly because a material of the gate wire is metal Mo which has a small thermal conductivity (Mo has a thermal conductivity of 138 W/(m·K) (Watts/(meter·Kelvin)). In the case of inputting a high voltage to the gate wire, the wire produces more heat which cannot be dissipated in an extremely short time, so that the insulating layer above the gate wire peels off when heated.

After further research, the inventors of the present disclosure have further found that after a high voltage is applied to the wire electrically connected to a source or a drain (which may be referred to as a source wire or a drain wire correspondingly), an insulating layer (e.g., a planarizqation layer and/or pixel definition layer) above the wire is not likely to peel off, i.e. there is no burn problem. This is because a material of the source wire or the drain wire is metal Al, which has a large thermal conductivity (Al has a thermal conductivity of 237 W/(m·K)). The heat can be rapidly dissipated through the metal Al, so that there is less damage to the insulating layer above the wire. Therefore, the insulating layer above the source wire or the drain wire is not likely to peel off.

In view of this, embodiments of the present disclosure provide a wire structure for a display panel to improve the heat dissipation effect, thereby reducing the problems that the planarization layer and/or the pixel defination layer are burnt or peeled off. The wire structure according to some embodiments of the present disclosure will be described in detail below in conjunction with the accompanying drawings.

FIG. 1A is a cross-sectional view showing a wire structure for a display panel according to an embodiment of the present disclosure.

As shown in FIG. 1A, the wire structure comprises a first wire layer 101 and a thermally conductive layer 121 above the first wire layer 101. A thermal conductivity of the thermally conductive layer 121 is greater than a thermal conductivity of the first wire layer 101. For example, the first wire layer 101 may be electrically connected to a gate (not shown) of a thin film transistor of the display panel. For example, the thermally conductive layer may be a metal pad layer. In addition, FIG. 1A also shows a planarization layer 103 on the thermally conductive layer 121 and a pixel defination layer 104 on the planarization layer 103.

In the embodiment, the heat generated by the first wire layer due to the high voltage applied to the first wire layer may be rapidly dissipated by providing the thermally conductive layer above the first wire layer. In this way, the heat dissipation effect of the wire structure may be improved, thereby reducing the problem that the insulating layer (e.g., the planarization layer and/or the pixel defination layer) above the first wire layer might be burnt or peeled off. In addition, the wire structure may not affect the display of the pixel area in the display panel.

In some embodiments, as shown in FIG. 1A, the wire structure may further comprise a first insulating layer 111 between the first wire layer 101 and the thermally conductive layer 121. For example, a material of the first insulating layer 111 may comprise silicon oxide or silicon nitride. This may prevent short-circuit between the thermally conductive layer and different first wire layers, thereby preventing short-circuit between different first wire layers.

In other embodiments, the first insulating layer 111 may not be provided between the first wire layer 101 and the thermally conductive layer 121. That is, the thermally conductive layer 121 may be on a surface of the first wire layer 101, as long as it is ensured that the thermally conductive layer is not in contact with other first wire layers.

Therefore, when it is described that the thermally conductive layer 121 is above the first wire layer 101, this term "above" may mean that the thermally conductive layer 121 is located above the first wire layer 101 in a non-contact manner (e.g., the first insulating layer 111 is provided between the first wire layer 101 and the thermally conductive layer 121), or may also mean that the thermally conductive layer 121 is located on the surface of the first wire layer 101 in direct contact.

In some embodiments, a material of the first wire layer may comprise molybdenum (Mo). A thermal conductivity of molybdenum is 138 W/(m·K).

In some embodiments, the thermal conductivity of the thermally conductive layer 121 is greater than 200 W/(m·K). For example, a material of the thermally conductive layer may comprise at least one of aluminum (Al), copper (Cu), gold (Au) or silver (Ag). A thermal conductivity of aluminum is 237 W/(m·K), a thermal conductivity of copper is 401 W/(m·K), a thermal conductivity of gold is 317 W/(m·K), and a thermal conductivity of silver is 429 W/(m·K).

Of course, those skilled in the art may understand that the thermal conductivity of the thermally conductive layer in the embodiments of the present disclosure does not have to be greater than 200 W/(m·K). For example, the thermal conductivity may be less than 200 W/(m·K), as long as it is greater than the thermal conductivity of the first wire layer (e.g., molybdenum). For example, the material of the thermally conductive layer may comprise tungsten (W), magnesium (Mg), or the like. A thermal conductivity of tungsten is 180 W/(m·K), and a thermal conductivity of magnesium is 156 W/(m·K).

In some embodiments, an orthographic projection of the first wire layer 101 on a plane where the thermally conductive layer 121 is located at least partially overlaps with an orthographic projection of the thermally conductive layer 121 on the plane where the thermally conductive layer 121 is located. For example, the orthographic projection of the first wire layer 101 on the plane where the thermally conductive layer 121 is located may be located inside the orthographic projection of the thermally conductive layer 121 on the plane where the thermally conductive layer 121 is located.

Figure 1B:
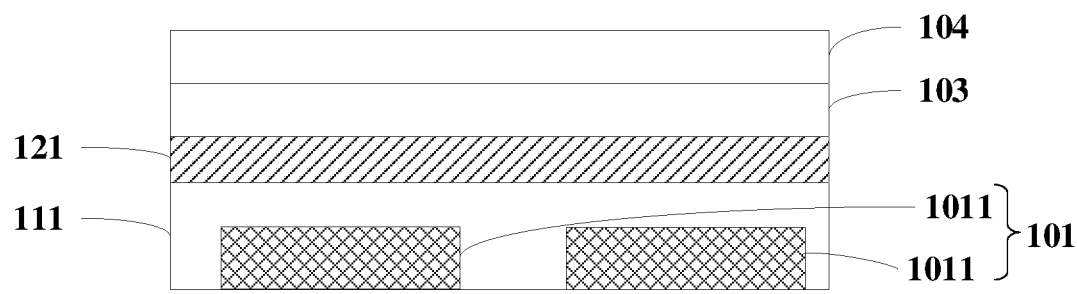
FIG. 1B is a cross-sectional view showing a wire structure for a display panel according to another embodiment of the present disclosure.

FIG. 1B is a cross-sectional view showing a wire structure for a display panel according to another embodiment of the present disclosure. FIG. 1B shows the first wire layer 101, the thermally conductive layer 121, the first insulating layer 111, the planarization layer 103, and the pixel defination layer 104.

In some embodiments, as shown in FIG. 1B, the first wire layer 101 may comprise a plurality of first wire portions 1011 spaced apart and in the same layer. For example, the display panel comprises a plurality of thin film transistors, and a gate of each thin film transistor may be connected to a corresponding first wire portion. That is, gates of the plurality of thin film transistors may be connected to the plurality of first wire portions in a one-to-one correspondence. Therefore, the wire structure may comprise a plurality of first wire portions in the same layer. In this case, the thermally conductive layer 121 is above the plurality of first wire portions 1011. For example, an integral thermally conductive layer may be provided above the plurality of first wire portions, so that it is relatively simple and convenient during manufacturing. In other embodiments, a thermally conductive layer may also be provided above each of the plurality of first wire portions.

In some embodiments, an orthographic projection of the plurality of first wire portions 1011 on the plane where the thermally conductive layer 121 is located at least partially overlaps with the orthographic projection of the thermally conductive layer 121 on the plane where the thermally conductive layer 121 is located. For example, the orthographic projection of the plurality of first wire portions 1011 on the plane where the thermally conductive layer 121 is located may be located inside the orthographic projection of the thermally conductive layer 121 on the plane where the thermally conductive layer 121 is located.

Figure 2:
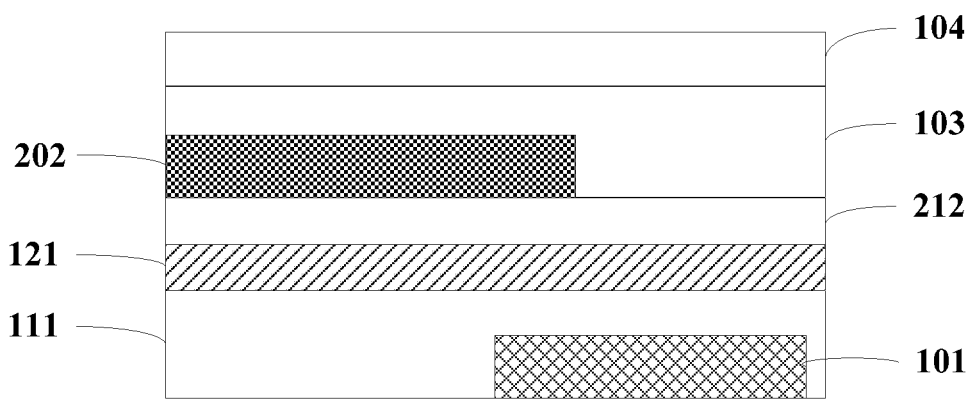
FIG. 2 is a cross-sectional view showing a wire structure for a display panel according to another embodiment of the present disclosure.

FIG. 2 is a cross-sectional view showing a wire structure for a display panel according to another embodiment of the present disclosure. Similar to the wire structure shown in FIG. 1A, the wire structure shown in FIG. 2 comprises the first wire layer 101, the thermally conductive layer 121, and the first insulating layer 111. In addition, FIG. 2 also shows the planarization layer 103 and the pixel definition layer 104.

In some embodiments, as shown in FIG. 2, the wire structure may further comprise a second insulating layer 212 on a side of the thermally conductive layer 121 facing away from the first wire layer 101. The second insulating layer 212 is on the thermally conductive layer 121. For example, a material of the second insulating layer 212 may comprise silicon oxide, silicon nitride, or the like.

In some embodiments, as shown in FIG. 2, the wire structure may further comprise a second wire layer 202 on a side of the second insulating layer 212 facing away from the thermally conductive layer 121. The second wire layer 202 is on the second insulating layer 212. The second insulating layer 212 is between the thermally conductive layer 121 and the second wire layer 202. The second wire layer 202 is electrically connected to a source or a drain (not shown) of a thin film transistor of the display panel. For example, a material of the second wire layer may comprise a metal such as aluminum.

In the above-described embodiment, it is possible to prevent short-circuit between the thermally conductive layer and the second wire layer by providing the second insulating layer.

It should be noted that FIG. 2 shows a case where the second wire layer and the thermally conductive layer are in different layers. However, the embodiments of the present disclosure are not limited thereto. The second wire layer and the thermally conductive layer may be in the same layer, and the second wire layer is isolated from the thermally conductive layer. In this way, the thermally conductive layer may also be formed during the process of forming the second wire layer, which simplifies the manufacturing process.

Figure 3:
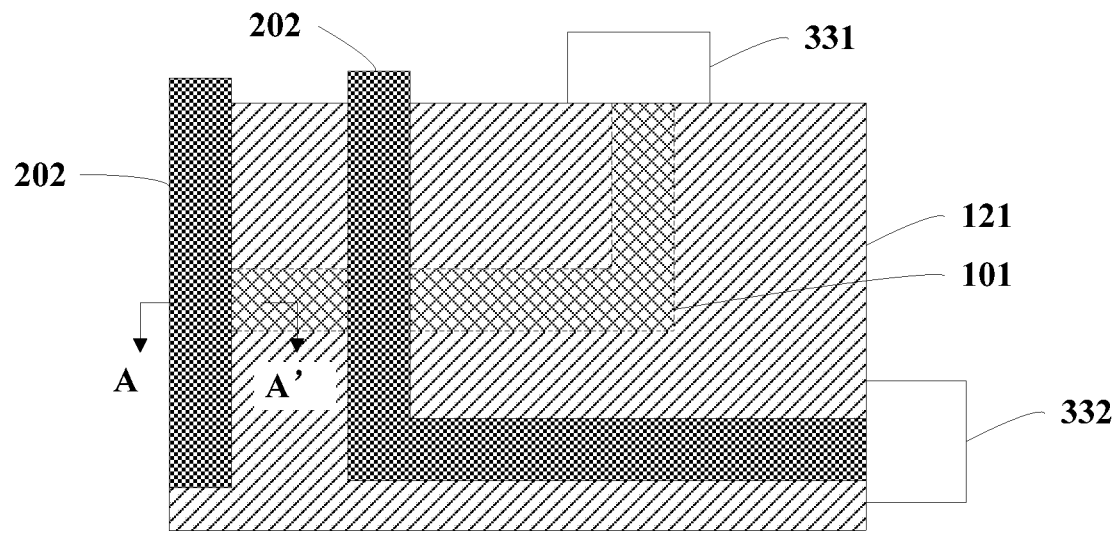
FIG. 3 is a top view showing a wire structure fora display panel according to an embodiment of the present disclosure.

FIG. 3 is a top view showing a wire structure for a display panel according to an embodiment of the present disclosure. FIG. 2 is a cross-sectional view of a structure taken along a line A-A' in FIG. 3. In FIG. 3, the first wire layer 101, the thermally conductive layer 121, and two second wire layers 202 are shown. The edge of the first wire layer 101 is shown by a broken line, which indicates that the first wire layer 101 is below the thermally conductive layer 121. It can be seen from FIG. 3 that the thermally conductive layer 121 may be an integral metal layer, so that it is more convenient during manufacturing. In addition, FIG. 3 also shows a first connecting piece 331 connected to the first wire layer 101 and a second connecting piece 332 connected to the second wire layer 202. The first connecting piece 331 and the second connecting piece 332 are respectively configured to receive a voltage.

In some embodiments of the present disclosure, a display panel is also provided. The display panel may comprise the wire structure as described above, such as the wire structure shown in FIG. 1A or 2.

In some embodiments of the present disclosure, a display device is also provided. The display device may comprise the display panel as described above. For example, the display device may comprise a display, a mobile phone, a tablet computer, a notebook computer, or the like.

Figure 4:
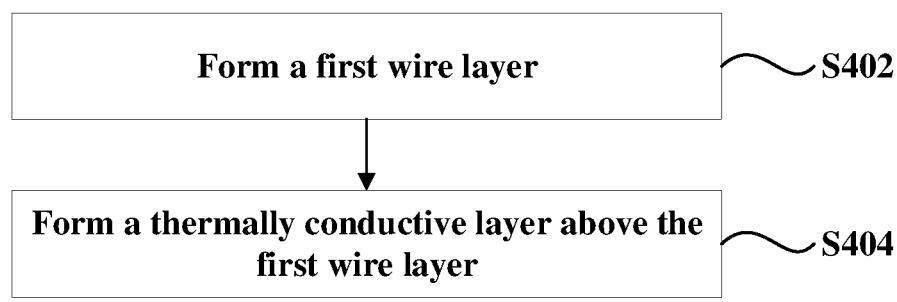
FIG. 4 is a flowchart showing a manufacturing method of a wire structure for a display panel according to an embodiment of the present disclosure.

FIG. 4 is a flowchart showing a manufacturing method of a wire structure for a display panel according to an embodiment of the present disclosure. As shown in FIG. 4, the manufacturing method comprises steps S402 to S404.

At step S402, a first wire layer is formed.

In some embodiments, the step S402 may comprise: forming the first wire layer electrically connected to a gate of a thin film transistor of the display panel. For example, the first wire layer may be formed on a substrate by processes such as deposition and patterning.

At step S404, a thermally conductive layer is formed above the first wire layer. A thermal conductivity of the thermally conductive layer is greater than a thermal conductivity of the first wire layer. For example, a material of the thermally conductive layer may comprise at least one of aluminum, copper, gold or silver.

In some embodiments, the step S404 may comprise: forming a first insulating layer on the first wire layer; and forming the thermally conductive layer on a side of the first insulating layer facing away from the first wire layer.

So far, a manufacturing method of a wire structure for a display panel according to some embodiments of the present disclosure is provided. In the manufacturing method, the heat generated by the first wire layer due to a high voltage applied to the first wire layer may be rapidly dissipated by providing the thermally conductive layer above the first wire layer. In this way, the heat dissipation effect of the wire structure may be improved, thereby reducing the problem that a insulating layer above the first wire layer might be burnt or peeled off.

In some embodiments, the forming of the first wire layer comprises: forming a plurality of first wire portions spaced apart in a same layer. The thermally conductive layer is formed above the plurality of first wire portions. For example, an integral thermally conductive layer may be formed above the plurality of first wire portions. During the process of forming the thermally conductive layer, a patterning process may be performed on the thermally conductive layer so that an active area containing a transistor or the like does not comprise the thermally conductive layer, and the thermally conductive layer is retained above the plurality of first wire portions.

In some embodiments, the manufacturing method may further comprise: forming a second insulating layer on a side of the thermally conductive layer facing away from the first wire layer. For example, the second insulating layer is formed on a surface of the thermally conductive layer. The manufacturing method may further comprise: forming a second wire layer on a side of the second insulating layer facing away from the thermally conductive layer. For example, the second wire layer is formed on a surface of the second insulating layer. The second wire layer is electrically connected to a source or a drain of a thin film transistor of the display panel. The second wire layer may be a source wire or a drain wire.

In some embodiments, a second wire layer is formed on a side of the first insulating layer facing away from the first wire layer, and the second wire layer is electrically connected to a source or a drain of a thin film transistor of the display panel. The thermally conductive layer is formed during the formation of the second wire layer. In this way, the second wire layer and the thermally conductive layer are located in the same layer and isolated from each other.

For example, in some cases, it is possible that there is no second wire layer above some first wire layers. In this way, during the process of manufacturing second wire layers at other positions, a mask for the second wire layers may be modified, so that a thermally conductive layer located in the same layer as these second wire layers may also be formed during the process of forming the second wire layers. The thermally conductive layer is above the first wire layer. This simplifies the process.

Figure 5:
FIG. 5 is a cross-sectional view showing a structure at a stage during a manufacturing process of a wire structure for a display panel according to an embodiment of the present disclosure.
Figure 6:
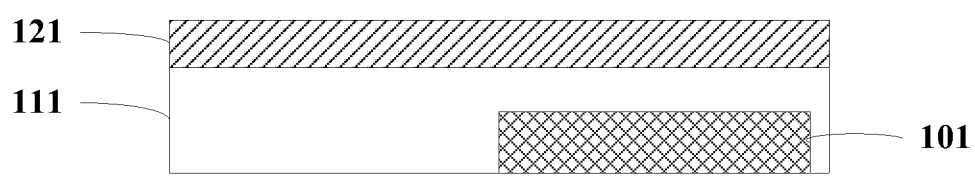
FIG. 6 is a cross-sectional view showing a structure at a stage during a manufacturing process of a wire structure for a display panel according to an embodiment of the present disclosure.
Figure 7:
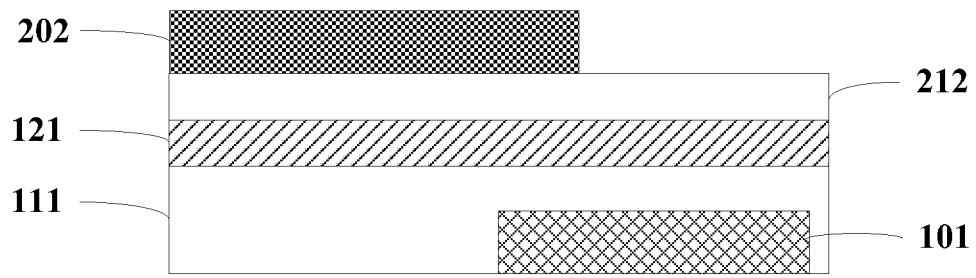
FIG. 7 is a cross-sectional view showing a structure at a stage during a manufacturing process of a wire structure for a display panel according to an embodiment of the present disclosure.

FIGS. 5 to 7 are cross-sectional views showing structures at several stages during a manufacturing process of a wire structure for a display panel according to some embodiments of the present disclosure. The manufacturing process of the wire structure according to some embodiments of the present disclosure will described in detail below in conjunction with FIGS. 5 to 7.

First, as shown in FIG. 5, for example, a first wire layer 101 is formed on a substrate (not shown). For example, the first wire layer 101 may be electrically connected to a gate (not shown) of a thin film transistor of a display panel.

Next, as shown in FIG. 5, a first insulating layer 111 is formed on the first wire layer 101 for example by a deposition process. The first insulating layer 111 covers the first wire layer 101. For example, a material of the first insulating layer 111 may comprise silicon oxide, silicon nitride, or the like.

Next, as shown in FIG. 6, a thermally conductive layer 121 is formed on a side of the first insulating layer 111 facing away from the first wire layer 101 by processes such as deposition and patterning.

Next, as shown in FIG. 7, a second insulating layer 212 is formed on a side of the thermally conductive layer 121 facing away from the first wire layer 101. For example, a material of the second insulating layer 212 may comprise silicon oxide, silicon nitride, or the like.

Next, as shown in FIG. 7, a second wire layer 202 is formed on a side of the second insulating layer 212 facing away from the thermally conductive layer 121.

Next, a planarization layer 103 covering the second wire layer 202 is formed, and a pixel defination layer 104 is formed on the planarization layer 103 so as to form the structure as shown in FIG. 2.

So far, a manufacturing method of a wire structure for a display panel according to some embodiments of the present disclosure is provided. the heat generated by the first wire layer due to a high voltage applied to the first wire layer may be rapidly dissipated during performing an aging process on the thin film transistor, by providing the thermally conductive layer above the first wire layer. In this way, the heat dissipation effect of the wire structure may be improved, thereby reducing the problem that the planarization layer and/or the pixel definition layer might be burnt or peeled off. This manufacturing method is relatively simple and easy to implement.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A wire structure for a display panel, comprising:
a first wire layer;
a thermally conductive layer above the first wire layer, wherein a thermal conductivity of the thermally conductive layer is greater than a thermal conductivity of the first wire layer;
a second insulating layer on a side of the thermally conductive layer facing away from the first wire layer; and
a second wire layer on a side of the second insulating layer facing away from the thermally conductive layer, wherein the second wire layer is electrically connected to a source or a drain of a thin film transistor of the display panel.

2. The wire structure according to claim 1, further comprising:

a first insulating layer between the first wire layer and the thermally conductive layer.

3. The wire structure according to claim 1, wherein the thermal conductivity of the thermally conductive layer is greater than 200 W/(m·K).

4. The wire structure according to claim 1, wherein a material of the thermally conductive layer comprises at least one of aluminum, copper, gold or silver.

5. The wire structure according to claim 1, wherein an orthographic projection of the first wire layer on a plane where the thermally conductive layer is located at least partially overlaps with an orthographic projection of the thermally conductive layer on the plane where the thermally conductive layer is located.

6. The wire structure according to claim 1, wherein the first wire layer is electrically connected to a gate of a thin film transistor of the display panel.

7. The wire structure according to claim 1, wherein the first wire layer comprises a plurality of first wire portions spaced apart and in a same layer, wherein the thermally conductive layer is above the plurality of first wire portions.

8. The wire structure according to claim 7, wherein an orthographic projection of the plurality of first wire portions on a plane where the thermally conductive layer is located at least partially overlaps with an orthographic projection of the thermally conductive layer on the plane where the thermally conductive layer is located.

9. A display panel, comprising: the wire structure according to claim 1.

10. A display device, comprising: the display panel according to claim 9.

11. A manufacturing method of a wire structure for a display panel, comprising:
forming a first wire layer;
forming a thermally conductive layer above the first wire layer, wherein a thermal conductivity of the thermally conductive layer is greater than a thermal conductivity of the first wire layer;
forming a second insulating layer on a side of the thermally conductive layer facing away from the first wire layer; and
forming a second wire layer on a side of the second insulating layer facing away from the thermally conductive layer, wherein the second wire layer is electrically connected to a source or a drain of a thin film transistor of the display panel.

12. The manufacturing method according to claim 11, wherein the forming of the thermally conductive layer above the first wire layer comprises:
forming a first insulating layer on the first wire layer; and
forming the thermally conductive layer on a side of the first insulating layer facing away from the first wire layer.

13. The manufacturing method according to claim 12, further comprising:
forming a second wire layer on a side of the first insulating layer facing away from the first wire layer, wherein the second wire layer is electrically connected to a source or a drain of a thin film transistor of the display panel,
wherein the thermally conductive layer is formed during a process of forming the second wire layer.

14. The manufacturing method according to claim 11, wherein a material of the thermally conductive layer comprises at least one of aluminum, copper, gold or silver.

15. The manufacturing method according to claim 11, wherein the forming of the first wire layer comprises:
forming the first wire layer electrically connected to a gate of a thin film transistor of the display panel.

16. The manufacturing method according to claim 11, wherein the forming of the first wire layer comprises:
forming a plurality of first wire portions spaced apart in a same layer, wherein the thermally conductive layer is formed above the plurality of first wire portions.

* * * * *